United States Patent
Kuznetzov et al.

(10) Patent No.: US 9,733,580 B2
(45) Date of Patent: Aug. 15, 2017

(54) METHOD FOR PRODUCING A REFLECTIVE OPTICAL ELEMENT FOR EUV-LITHOGRAPHY

(71) Applicant: CARL ZEISS SMT GmbH, Oberkochen (DE)

(72) Inventors: Alexey Kuznetzov, Utrecht (NL); Michael Gleeson, Leiderdorp (NL); Robbert W. E. Van De Kruijs, Nieuwegein (NL); Frederik Bijkerk, Bosch en Duin (NL)

(73) Assignee: Carl Zeiss SMT GmbH, Oberkochen (DE)

( * ) Notice: Subject to any disclaimer, the term of this patent is extended or adjusted under 35 U.S.C. 154(b) by 10 days.

(21) Appl. No.: 14/137,225

(22) Filed: Dec. 20, 2013

(65) Prior Publication Data

US 2014/0193591 A1    Jul. 10, 2014

Related U.S. Application Data

(63) Continuation of application No. PCT/EP2012/061704, filed on Jun. 19, 2012.
(Continued)

(30) Foreign Application Priority Data

Jun. 22, 2011    (DE) .................. 10 2011 077 983

(51) Int. Cl.
*G03F 7/20* (2006.01)
*C23C 14/54* (2006.01)
(Continued)

(52) U.S. Cl.
CPC .......... *G03F 7/70958* (2013.01); *B82Y 10/00* (2013.01); *C23C 14/35* (2013.01);
(Continued)

(58) Field of Classification Search
CPC ....... B28Y 10/00; C23C 14/35; C23C 14/542; G02B 5/0875; B02B 5/0891
See application file for complete search history.

(56) References Cited

U.S. PATENT DOCUMENTS 6,134,049 A * 10/2000 Spiller ................. G02B 5/0875
                                                                  359/359
6,160,867 A    12/2000 Murakami
(Continued)

FOREIGN PATENT DOCUMENTS

DE       101 55 711 A1    5/2003
DE    102008042212 A1    4/2010
(Continued)

OTHER PUBLICATIONS

International Search Report for PCT/EP2012/061704 dated Oct. 1, 2012.
(Continued)

*Primary Examiner* — Dah-Wei D Yuan
*Assistant Examiner* — Kristen A Dagenais
(74) *Attorney, Agent, or Firm* — Edell, Shapiro & Finnan, LLC

(57) ABSTRACT

A method aleviating blistering, cracking and chipping in topmost layers of a multilayer system exposed to reactive hydrogen, when producing a reflective optical element (50) having a maximum reflectivity at an operating wavelength of 5 nm to 20 nm. A multilayer system (51) composed of 30-60 stacks (53) is applied to a substrate (52). Each stack has a layer (54) of thickness $d_{MLs}$ composed of a high refractive index material and a layer (55) of thickness $d_{MLa}$ composed of a low refractive index material. The thickness ratio is $d_{MLa}/(d_{MLa}+d_{MLs})=\Gamma_{ML}$. Two to five further stacks (56) are applied to the multilayer system. at least one further stack having a layer (54) of thickness $d_s$ composed of a high refractive index material and a layer (55) of thickness $d_a$ (Continued)

composed of a low refractive index material, wherein the thickness ratio is $d_a/(d_a+d_s)=\Gamma$ and wherein $\Gamma \neq \Gamma_{ML}$.

8 Claims, 2 Drawing Sheets

Related U.S. Application Data

(60) Provisional application No. 61/499,905, filed on Jun. 22, 2011.

(51) Int. Cl.
    *C23C 14/35* (2006.01)
    *G02B 5/08* (2006.01)
    *G21K 1/06* (2006.01)
    *B82Y 10/00* (2011.01)

(52) U.S. Cl.
    CPC .......... *C23C 14/542* (2013.01); *G02B 5/0875* (2013.01); *G02B 5/0891* (2013.01); *G21K 1/062* (2013.01)

(56) References Cited

U.S. PATENT DOCUMENTS

| | | |
|---|---|---|
| 2003/0008148 A1 | 1/2003 | Bajt et al. |
| 2004/0002009 A1 | 1/2004 | Yan |
| 2006/0062348 A1* | 3/2006 | Shiraishi ................. 378/34 |
| 2007/0171327 A1 | 7/2007 | Matsumodo et al. |
| 2007/0287076 A1* | 12/2007 | Masaki ................. B82Y 10/00 430/5 |
| 2009/0148695 A1 | 6/2009 | Miura et al. |
| 2010/0027107 A1* | 2/2010 | Yakshin ................. G21K 1/062 359/360 |
| 2012/0134015 A1 | 5/2012 | Paul et al. |
| 2012/0212810 A1 | 8/2012 | Paul et al. |
| 2012/0314281 A1 | 12/2012 | Von Blanckenhagen |
| 2012/0320348 A1 | 12/2012 | Kamenov et al. |

FOREIGN PATENT DOCUMENTS

| | | |
|---|---|---|
| DE | 102009017095 A1 | 10/2010 |
| DE | 102009032779 A1 | 1/2011 |
| DE | 102009054986 A1 | 6/2011 |
| EP | 1 148 149 A2 | 10/2001 |
| EP | 1 306 698 A1 | 5/2003 |
| JP | 2005516182 A | 6/2005 |
| JP | 2006203095 A | 8/2006 |
| JP | 2007057450 A | 3/2007 |
| JP | 2009156863 A | 7/2009 |
| WO | 2004109778 A1 | 12/2004 |
| WO | 2010/118928 A1 | 10/2010 |
| WO | 2011039061 A1 | 4/2011 |

OTHER PUBLICATIONS

Written Opinion for PCT/EP2012/061704 dated Oct. 1, 2012.
Office Action in corresponding Japanese Application No. 2014-516307, dated Apr. 28, 2016, along with an English translation.
Colin, J. et al., "Adhesion increase by interface mixing", Philosophical Magazine A, 1997, vol. 75, No. 2, 369-377.
Kuznetsov, A. S. et al., "Blistering behavior in Mo/Si multilayers", Proc. SPIE 8077, May 13, 2011.
Zoethout, E. et al., "Stress mitigation in Mo/Si Multilayers for EUV lithography", Proc. SPIE, 5037, 872, Jun. 2003.
Kessels, M. J. H., et al., "Ion-induced interface layer formation in W/Si and WRe/Si multilayers", Surface Science 582, 2005, 227-234.
Kuznetsov, A. S. et al., "Hydrogen-induced blistering mechanisms in thin film coatings", J. Phys: Condensed Matter, Dec. 2011.
Pelizzo, M. G. et al., "Stability of extreme ultraviolet multilayer coatings to low energy proton bombardment", Optics Express, vol. 19, No. 16, Aug. 2011.
Office Action in corresponding German Application No. 102011077983.3, dated Mar. 15, 2012, along with an English translation.
Office Action in corresponding Chinese Application No. 201280029959.7, dated Sep. 28, 2015, along with an English translation.
Office Action in corresponding Chinese Application No. 201280029959.7, dated Aug. 10, 2016, along with an English translation.
Office Action in corresponding Chinese Application 201280029959.7, mailed Jan. 25, 2017, along with English Translation.

* cited by examiner

METHOD FOR PRODUCING A REFLECTIVE OPTICAL ELEMENT FOR EUV-LITHOGRAPHY

The present application is a Continuation of International Application No. PCT/EP2012/061704, filed on Jun. 19, 2012, which claims priority of German Patent Application No. 10 2011 077 983.3, filed on Jun. 22, 2011, and U.S. Provisional Application No. 61/499,905, also filed on Jun. 22, 2011. The disclosures of these three applications are hereby incorporated into the present application by reference in their respective entireties.

FIELD AND BACKGROUND OF THE INVENTION

The present invention relates to a method for producing a reflective optical element for EUV lithography, which element has a maximum reflectivity at an operating wavelength in the range of 5 nm to 20 nm.

In EUV lithography apparatuses, reflective optical elements for the extreme ultraviolet (EUV) wavelength range (e.g. wavelengths between approximately 5 nm and 20 nm) such as, for instance, photomasks or mirrors on the basis of multilayer systems are used for the lithography of semiconductor components. Since EUV lithography apparatuses generally have a plurality of reflective optical elements, the latter must have as high a reflectivity as possible in order to ensure a sufficiently high total reflectivity. The reflectivity and the lifetime of the reflective optical elements can be reduced by contamination of the optically used reflective surface of the reflective optical elements that arises on account of the short-wave irradiation together with residual gases in the operating atmosphere. Since a plurality of reflective optical elements are usually arranged one behind another in an EUV lithography apparatus, even relatively small contaminations on each individual reflective optical element affect the total reflectivity to a relatively great extent.

Contamination can occur on account of moisture residues, for example. In this case, water molecules are dissociated by the EUV radiation and the resulting oxygen radicals oxidize the optically active surfaces of the reflective optical elements. A further source of contamination is polymers which can originate from the vacuum pumps used in EUV lithography apparatuses, for example, or from residues of photoresists used on the semiconductor substrates to be patterned and which lead to carbon contaminations on the reflective optical elements under the influence of the operating radiation. While oxidative contaminations are generally irreversible, carbon contaminations, in particular, can be removed, inter alia, by treatment with reactive hydrogen, by virtue of the reactive hydrogen reacting with the carbon-containing residues to form volatile compounds. Reactive hydrogen can be hydrogen radicals or else ionized hydrogen atoms or molecules.

OBJECTS AND SUMMARY

It has been observed, however, that under the influence of reactive hydrogen which is used for cleaning or can arise on account of the interaction of the EUV radiation with hydrogen present in the residual atmosphere, blistering and even detachment of individual layers, in particular close to the surface of the multilayer system, can occur.

Therefore, it is an object of the present invention to provide a method for producing a reflective optical element which can be used in EUV lithography even in the presence of reactive hydrogen.

This object is achieved with a method for producing a reflective optical element for EUV lithography, which element has a maximum reflectivity at an operating wavelength in the range of 5 nm to 20 nm, comprising:

applying to a substrate a multilayer system composed of thirty to sixty stacks arranged one above another, wherein each stack has a layer having a thickness $d_{MLs}$ composed of a material having a higher real part of the refractive index at the operating wavelength, and a layer having a thickness $d_{MLa}$ composed of a material having a lower real part of the refractive index at the operating wavelength, wherein the thickness ratio is $d_{MLa}/(d_{MLa}+d_{MLs})=\Gamma_{ML}$, applying one, two, three, four or five further stacks to the multilayer system, said at least one further stack having a layer having a thickness $d_s$ composed of a material having a higher real part of the refractive index at the operating wavelength, and a layer having a thickness $d_a$ composed of a material having a lower real part of the refractive index at the operating wavelength, wherein the thickness ratio is $d_a/(d_a+d_s)=\Gamma$ and wherein $\Gamma \neq \Gamma_{ML}$.

Investigations have revealed that blistering or detachment of topmost layers on the multilayer system, in particular in the presence of hydrogen in the residual gas atmosphere, can be significantly reduced if, on the multilayer system optimized for the reflection of a specific operating wavelength in the range of 5 nm to 20 nm, at least one further stack is applied in which the thickness ratio of the layers of higher and lower real parts of the refractive index is a different ratio than in the case of the underlying multilayer system. It is supposed that this targeted variation of the thickness ratio has the effect that lower stresses occur in the region of the topmost layers and the tendency toward blistering or detachment of the topmost layers is thereby reduced.

It is to be noted that the one or up to five further stacks are farther away from the substrate than are any of the stacks of the multilayer system.

It has proved to be particularly advantageous if two, three, four or five further stacks having a stress-compensating function are applied to said multilayer system that basically defines the optical properties of the reflective optical element and advantageously comprises thirty to sixty stacks. Since experience shows that hydrogen penetrates only into the topmost layers, effective protection against blistering and detachment can already be ensured with a small number of further stacks. Moreover, at the same time a possible impairment of the optical properties of the underlying multilayer system is restricted to a minimum. The actual number of further stacks can also be determined taking account of the energy and the concentration of the reactive hydrogen to which the reflective optical element produced for EUV lithography is expected to be exposed during the EUV lithography process.

In preferred embodiments, the thickness ratio $\Gamma$ of the at least one further stack is less than $0.8*\Gamma_{ML}$ of the multilayer system. Particularly preferably, the thickness ratio $\Gamma$ of the at least one further stack is greater than 1.2 times the thickness ratio $\Gamma_{ML}$ in the multilayer system. In the second-mentioned variant, in particular, a resulting tensile stress builds up in the topmost layers of the optical element, which according to observations has a particularly positive effect on reducing the tendency toward blistering and detachment of the topmost layers.

It should be pointed out that particularly in the case of reflective optical elements having, below the multilayer system serving for reflecting the operating wavelength, a further multilayer system for stress compensation, in the context of the production method proposed here, the number of layers in the stress-compensating multilayer system can be reduced since now stress-reduced layers are also provided on the optically active multilayer system at the transition to the vacuum. With the choice of $\Gamma < \Gamma_{ML}$, it may be necessary to provide an increased number of layers in the stress-compensating multilayer system.

In particularly preferred embodiments of the production method, at least one layer of the at least one further stack is applied via electron beam evaporation or ion beam assisted coating (also called IBAD, or ion beam assisted deposition) or magnetron sputtering with thermal particles (also called TPM, or thermal particle magnetron sputtering). In the case of ion beam assisted coating, a layer, during its application, is exposed to an ion beam having an energy of less than 100 eV, which leads to a densification of this layer. Ion beam assisted coating is preferably combined with electron beam evaporation. In the case of magnetron sputtering with thermal particles, the distance between target and substrate is not just a few centimeters, as in the case of conventional magnetron sputtering, but rather a few 10 cm to approximately 1 m. This special magnetron sputtering, too, can be carried out in ion beam assisted fashion. It is particularly preferred to apply in this way at least the one or the plurality of layers composed of material having a higher real part of the refractive index at the operating wavelength, since it has been observed that these layers are particularly susceptible to splitting open after exposure to reactive hydrogen. Preferably pure electron beam evaporation tends to be employed for reflective optical elements which are intended to be exposed in particular to reactive hydrogen having a higher energy, i.e. an energy of more than 100 eV.

It has proved to be particularly advantageous if, in the case of at least one layer of the at least one further stack, the otherwise customary polishing with ion beams for smoothing the layer surface is dispensed with. This is particularly highly advantageous if this involves the layer that was applied via electron beam evaporation or magnetron sputtering with thermal particles, regardless of whether the coating is ion beam assisted or not. However, also in the case of layers of the at least one further stack which was applied by conventional magnetron sputtering, a positive effect on the tendency toward blistering or detachment was observed. Alternatively, if polishing cannot be dispensed with on account of the requirement made of the surface roughnesses, a positive effect can be achieved by virtue of the energy of the ion beam for polishing being set such that the ion beam penetrates through the entire layer to be polished during polishing. Overall, the observations appear to indicate that the individual coating processes should be selected according to the respective layer being applied as homogeneously as possible. With the use of an ion beam having a higher energy for ion beam polishing, the positive effect can presumably also be attributed to the fact that the polished layer intermixes with the underlying layer to a greater extent and the mixed layer thus formed counteracts chipping of the polished layer.

Advantageously, as material having a higher real part of the refractive index at the operating wavelength, and/or as material having a lower real part of the refractive index at the operating wavelength, the same materials chosen for the stacks of the multilayer system are respectively chosen for the at least one further stack. Preferably, both the materials having a lower and having a higher real part of the refractive index at the operating wavelength are selected to be respectively the same for the further stacks as well as for the stacks of the multilayer system. In particularly preferred embodiments, both in the multilayer system and in the at least one further stack, silicon is chosen as material having a higher real part of the refractive index at the operating wavelength, and molybdenum is chosen as material having a lower real part of the refractive index at the operating wavelength. By choosing the same material combinations both for the multilayer system and for the further stack, overall the production method can be carried out more simply and more cost-effectively. The specific choice of silicon and molybdenum affords the advantage that a particularly high reflectivity in the wavelength range of between 12.5 nm and 15 nm can be achieved with this material combination. Moreover, there is great experience in coating with these two materials, such that a high reproducibility can be achieved during the production of a multiplicity of reflective optical elements according to the method proposed here. It should be pointed out that, of course, in the optical multilayer system and in the at least one further stack, different materials can be employed if desired and, besides silicon and molybdenum, it is possible to use all further material combinations in respect of which it is known that they can be used for high reflectivities at operating wavelengths in the range of 5 nm to 20 nm.

In further preferred embodiments, as material having a higher real part of the refractive index at the operating wavelength, and as material having a lower real part of the refractive index at the operating wavelength, materials chosen for the stacks of the multilayer system are different than those chosen for the at least one further stack, in order to be able to adapt the resulting reflective optical element particularly well to the planned use conditions and to be able to select, in particular, layer materials for the at least one further stack which as such already exhibit a particularly low tendency toward blistering in the presence of reactive hydrogen.

Particularly for use in lithography processes where the resulting optical element is subjected to low-energy hydrogen radicals and ions and/or the exposure is carried out at elevated temperatures, it has proved to be advantageous for an additional layer as diffusion barrier to be applied into the at least one further stack between the layer having a lower refractive index at the operating wavelength and the layer having a higher refractive index at the operating wavelength, which additional layer can also have a positive effect on the reflectivity of the reflective optical element at the operating wavelength.

In a preferred embodiment, it has proved to be advantageous for a layer composed of a material having a low density and low stress to be applied on the at least one further stack. Said layer can absorb hydrogen, in particular, without significantly influencing the optical properties of the multilayer system and without inducing relatively large additional stresses. Advantageously, said layer is composed of a material from the group comprising silicon, silicon nitride, silicon oxide, silicon carbide, boron, boron carbide, boron nitride, beryllium, and carbon.

In one variant of the preferred embodiment, a layer composed of a material which also affords protection against further influences such as oxidative contamination or carbon-containing contamination or can readily be cleaned of the contamination by hydrogen cleaning is applied to the at least one further stack. Preferred materials belong to the group comprising ruthenium, cerium, yttrium, molybdenum silicide, yttrium oxide, molybdenum sulfide, zirconium, niobium, molybdenum carbide, zirconium oxide, rhodium, and rhenium. A large part of the impinging hydrogen can be absorbed in said layer, such that it does not penetrate to the underlying layers of the at least one further stack or even of the multilayer system.

Particularly preferably, in particular if the resulting reflective optical element is predominantly exposed to reactive hydrogen having a higher energy, both a layer composed of a material having lower density and low stress and a protective layer composed of an aforementioned material are applied on the at least one further stack.

BRIEF DESCRIPTION OF THE DRAWINGS

The present invention will be explained in greater detail with reference to a preferred exemplary embodiment. In this respect FIGS. 1a,b show a schematic illustration of reflective optical elements for EUV lithography which were produced according to the method proposed here.

DETAILED DESCRIPTION OF EXEMPLARY EMBODIMENTS

Figure 1A:
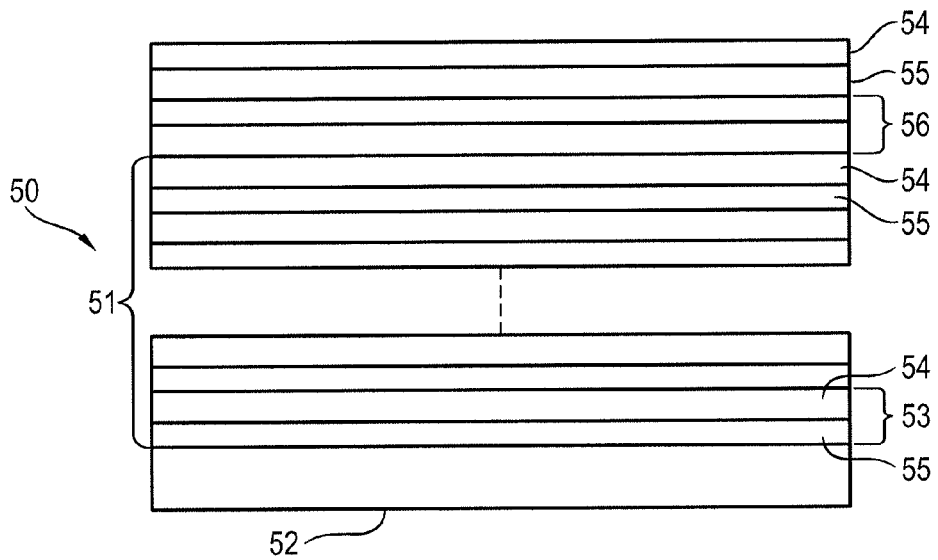

FIGS. 1a,b schematically illustrate the structure of exemplary reflective optical elements 50 produced in accordance with the method proposed here.

The examples illustrated involve reflective optical elements based on a multilayer system 51. This involves alternately applied layers of a material having a higher real part of the refractive index at the operating wavelength at which, for example, the lithographic exposure is carried out, (also called spacers 54) and of a material having a lower real part of the refractive index at the operating wavelength (also called absorbers 55), wherein an absorber-spacer pair forms a stack 53. In a way a crystal whose lattice planes correspond to the absorber layers at which Bragg reflection takes place is thereby simulated. Each stack 53 is characterized, inter alia, by the layer thickness ratio of the absorber layer thickness $d_{ML_a}$ with respect to the spacer layer thickness $d_{ML_s}$. In particular, the layer thickness ratio $\Gamma_{ML}=d_{ML_a}/(d_{ML_a}+d_{ML_s})$ can be defined. The multilayer system 51 is applied on a substrate 52. Materials having a low coefficient of thermal expansion are preferably chosen as substrate materials.

Figure 1B:
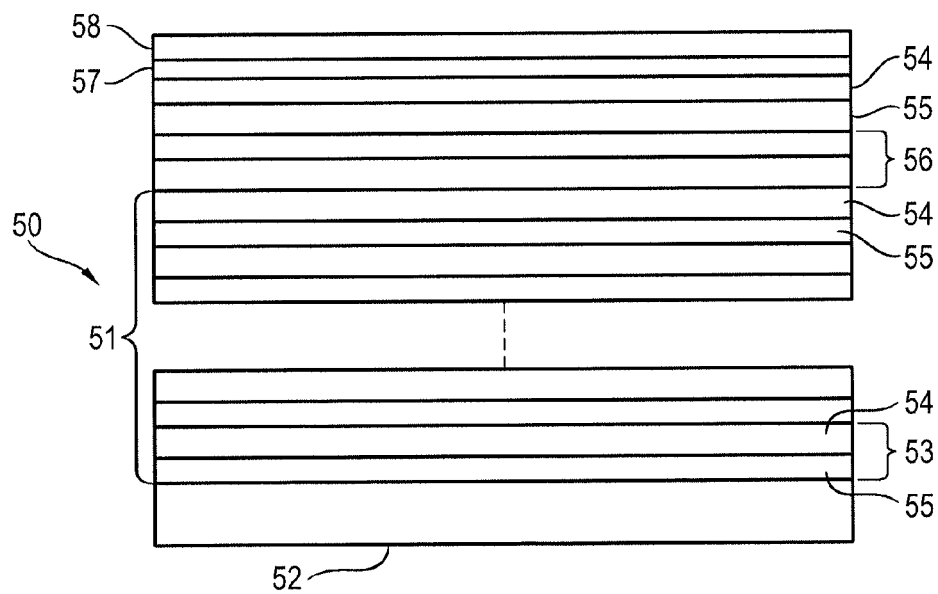

Both in the example illustrated in FIG. 1a and in the example illustrated in FIG. 1b, two further stacks 56 are applied on the multilayer system 51 and are thus farther away from the substrate 52 than the stacks 53 of the optically active multilayer system 50. It should be pointed out that only one further stack 56 or else three, four or five further stacks 56 can also be provided in further exemplary embodiments. In the two examples illustrated here, each additional stack 56 respectively comprises a spacer layer 54 and an absorber layer 55. In the examples illustrated here, the same materials as for the underlying multilayer system 51 have been chosen as absorber and spacer materials. In one concrete, particularly preferred embodiment, the absorber material is molybdenum and the spacer material is silicon. Reflective optical elements 50 for EUV lithography which are based on such a multilayer system 51 can be optimized for a particularly high reflectivity in particular for operating wavelengths in a range of between 12.5 nm and 15 nm.

Depending on the position of the desired operating wavelength and depending on the requirement made of the optical properties and the lifetime, other absorber and spacer materials than molybdenum and silicon may have been chosen both for the multilayer system 51 and for the further stacks 56. In particular, different materials for the spacer and absorber layers can also be chosen for the multilayer system 51, on the one hand, and the further stacks 56, on the other hand. In the choice of materials and in the choice of the number of further stacks 56, account is advantageously taken of what concentration of reactive hydrogen the reflective optical element is expected to be exposed to and for how long during the lithography process and what energy said hydrogen will have on average. Furthermore, account is advantageously taken of what reflectivity losses possibly have to be accepted as a result of the further stacks 56.

It should be pointed out that the further stacks can have further layers apart from the absorber and spacer layers 54, 55. Particularly preferably, additional layers as diffusion barriers are applied at the interfaces between spacer and absorber layers or absorber and spacer layers. When using silicon as spacer material and molybdenum as absorber material, boron carbide, for example, has proved to be advantageous as material for diffusion barriers. The provision of diffusion barriers in the further stacks 56 has particular advantages if the reflective optical element 50 is predominantly exposed to low-energy hydrogen atoms and radicals, having an energy of less than 100 eV. Moreover, they are advantageous in the case of reflective optical elements that are operated at temperatures significantly above room temperature.

It is of major importance that the thickness ratio $\Gamma=d_a/(d_a+d_s)$ where $d_a$ is the thickness of the absorber layer 55 in the further stack 56 and $d_s$ is the thickness of the spacer layer 54 in the further stack 56 is different than the corresponding thickness ratio in the $\Gamma_{ML}$ in the multilayer system 51. If $\Gamma_{ML}$ should vary in the multilayer system and the individual stacks 53 thereof and/or if the thickness ratio $\Gamma$ should vary over individual further stacks 56, it is of importance that all $\Gamma$ are different than all $\Gamma_{ML}$. Preferably, $\Gamma$ and $\Gamma_{ML}$ differ significantly; $\Gamma$ is preferably greater than $1.2*\Gamma_{ML}$ or less than $0.8*\Gamma_{ML}$. In the example illustrated here, the multilayer system 51 is a conventional molybdenum-silicon system comprising fifty stacks 53 all having a $\Gamma_{ML}$ of 0.4 with a stack thickness of 7.2 nm. The two further stacks 56, by contrast, have a $\Gamma$ of 0.6 with likewise a stack thickness of 7.2 nm. This leads to a resulting stress of 200 MPa over the two further stacks 56, which compensates for stresses in the underlying multilayer system 51. The stress is compensated for, in particular, in the region of the topmost stack 53 of the multilayer system 51. This appears to be a reason why a significantly reduced tendency toward blistering and detachment of individual layers, in particular of the silicon layer, was observed under the influence of reactive hydrogen. It should be pointed out that otherwise for stress reduction over the entire reflective optical element stress-reducing layers can also be arranged between the substrate 52 and the multilayer system 51.

The exemplary embodiment illustrated in FIG. 1b differs from the exemplary embodiment illustrated in FIG. 1a to the effect that two further additional layers 57 and 58 were also applied on the two further stacks 56. The additional layer 58 situated at the interface with the vacuum is a conventional protective layer for protection against contamination, which is ideally also inert toward hydrogen cleaning and, moreover serves as a buffer layer against reactive hydrogen, in order to suppress penetration of the reactive hydrogen as far as the multilayer system. Suitable materials are ruthenium, cerium, yttrium, molybdenum silicide, yttrium oxide, molybdenum sulfide, zirconium, niobium, molybdenum carbide, zirconium oxide, rhodium or rhenium. In the example illustrated here, ruthenium was chosen as material for the protective layer 58.

The underlying layer 57 is a layer composed of a low-stress material having a low density, which can absorb hydrogen. Said layer, as in the example illustrated here, can be arranged below the protective layer 58; in other variants, it can also be arranged above the protective layer 58. Suitable materials are, for example, silicon, silicon nitride, silicon oxide, silicon carbide, boron, boron carbide, boron nitride, beryllium or carbon. In the example illustrated here, silicon nitride was chosen as layer material for the layer 57. Through a corresponding choice of the thicknesses of the additional layers 57, 58, it is possible not only to increase the resistance of the reflective optical element 50 toward blistering and detachment of individual topmost layers, but also to optimize the reflective optical element 50 to the effect that the losses in reflectivity on account of the stacks 56 and layers 57, 58 situated on the multilayer system 51 do not turn out to be excessively high. The provision of additional layers 57 and/or 58 increases the lifetime of the corresponding reflective optical elements 50 particularly at higher flow rates of reactive hydrogen also having higher energy. It is to be noted that in further embodiments, only a low density, low stress layer 57 or only a protective layer 58 can be provided on the one or up to five further stacks 56.

It should be pointed out that, at particularly high flow rates of reactive hydrogen and/or particularly high energies of the reactive hydrogen, the lifetime of the reflective optical element used could also be lengthened somewhat by additionally introducing buffer gas into the residual gas atmosphere in the interior of the EUV lithography apparatus in which the reflective optical elements are used, in order already to reduce the energy of the particles impinging on the reflective optical elements in advance.

Figure 2A:
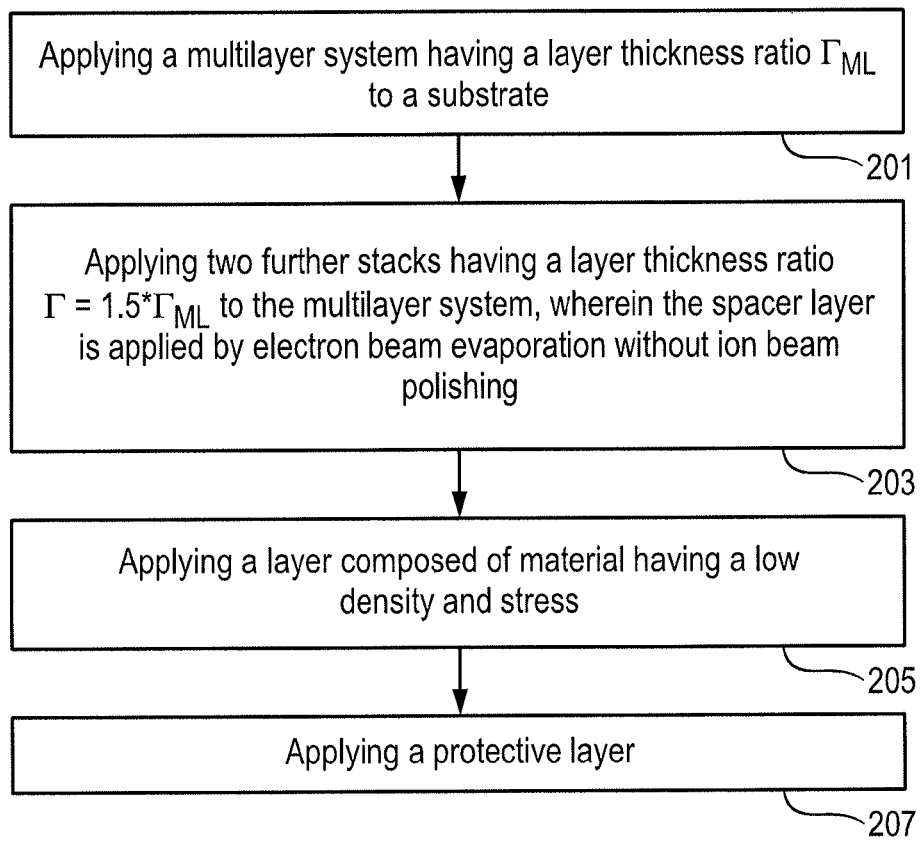
FIGS. 2a,b show flowcharts for exemplary variants of the method proposed here for producing reflective optical elements for EUV lithography.

The exemplary embodiment illustrated in FIG. 1b can be produced, for example, in accordance with the variant of the production method presented here as illustrated in FIG. 2a. For this purpose, firstly a multilayer system having a layer thickness ratio $\Gamma_{ML}$ is applied to a substrate in any conventional manner (step 201). Afterward, the two further stacks 56 having a layer thickness ratio of $\Gamma=1.5*\Gamma_{ML}$ in the present example are introduced onto the multilayer system 51, wherein the spacer layers are applied by electron beam evaporation without ion beam polishing (step 203). In a modification, the absorber layer can also be applied by electron beam evaporation without ion beam polishing. Particularly with the use of silicon as spacer material and molybdenum as absorber material, however, a reduction of blistering and detachment can already be significantly reduced by applying the spacer layer by electron beam evaporation without ion beam polishing, even in the presence of higher flow rates of reactive hydrogen having a higher energy. The absorber layer can therefore also be applied by conventional coating methods having higher growth rates than electron beam evaporation, in order to make the production method more efficient overall. It has likewise been observed that ion beam polishing of the absorber layer, particularly in the case of the material combination of molybdenum with silicon, has a significantly smaller influence on blistering and detachment behavior than ion beam polishing in the case of spacer layers. Therefore, in the case of reflective optical elements which have high demands placed on surface roughness including in the case of the additional layers in the further stack 56, the absorber layers can be conventionally polished with an ion beam.

Afterward, the layer composed of material having a low density and stress 57 (step 205) and the protective layer 58 (step 207) were applied to the two lower stacks 56 in a conventional manner.

Another variant of the production methods presented here can be used, for example, for the production of the reflective optical element as illustrated in FIG. 1a. This is illustrated schematically in a flowchart in FIG. 2b. After a first step 201, in which a multilayer system 51 having a layer thickness ratio $\Gamma_{ML}$ is applied to a substrate, the two further stacks 56 having a layer thickness ratio $\Gamma=1.5*\Gamma_{ML}$ in the present example were applied to the multilayer system 51 by a procedure in which, in particular, the spacer layer was in each case applied with ion beam assistance and then polished with a high-energy ion beam (step 204). Ion beam assisted application has somewhat higher growth rates than electron beam evaporation, which is very slow, but leads to a layer that is almost just as homogeneous as that achieved by electron beam evaporation. Using high-energy ion beam polishing wherein the energy of the ion beam is set such that the entire spacer layer is penetrated by the ion beam, the homogeneity of the spacer layer structure is likewise maintained. Moreover, polishing with the high-energy ion beam can have the effect that a mixed layer is formed at the boundary layer between the spacer layer and the underlying absorber layer, said mixed layer, just like the highest possible homogeneity of the spacer layer, counteracting blistering and detachment of topmost layers in the presence of reactive hydrogen.

Figure 2B:
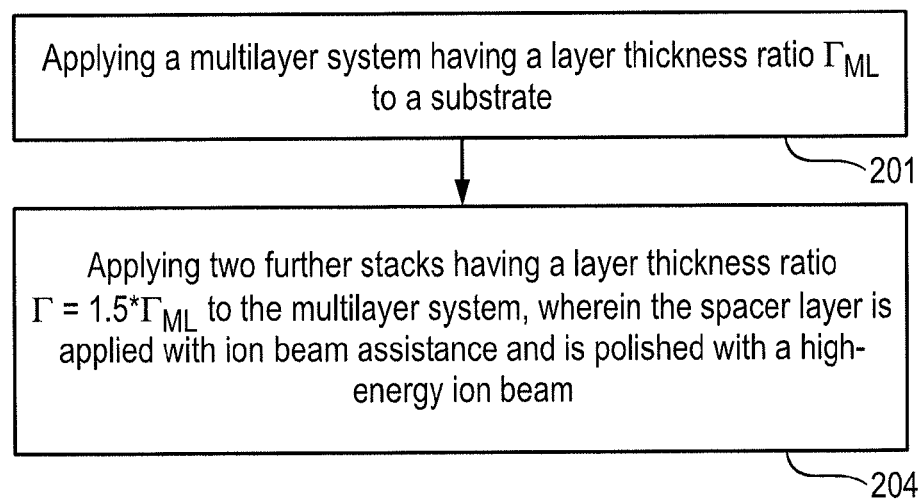

It should be pointed out that, both in the case of the procedure in accordance with the example illustrated in FIG. 2a and in the case of the procedure in accordance with the example illustrated in FIG. 2b, the layers of the further stacks can be applied by magnetron sputtering with thermal particles instead of electron beam evaporation. It should also be pointed out that the measures such as electron beam evaporation, dispensing with ion beam polishing, ion assisted application and polishing with high-energy ions can be combined with one another in any desired manner.

Furthermore, it should be pointed out that the temperature of the reflective optical element while it is exposed to reactive hydrogen can also influence the tendency toward blistering or detachment of layers. Particularly in the case of being subjected to reactive hydrogen having an energy of less than 100 eV, a lower tendency toward blistering or detachment of layers was observed at temperatures of below approximately 50° C. and above approximately 250° C.

The above description of various embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

The invention claimed is:

1. A method of producing a reflective optical element for extreme ultraviolet (EUV) lithography, which element has a maximum reflectivity at an operating wavelength in a range of 5 nm to 20 nm, comprising:
   applying to a substrate a first multilayer system composed of thirty to sixty stacks arranged one above another, wherein each stack has a layer having a thickness dMLs composed of a material having a higher real part of the refractive index at the operating wavelength and a layer having a thickness dMLa composed of a material having a lower real part of the refractive index at the operating wavelength, wherein the thickness ratio is $d_{MLa}/(d_{MLa}+d_{MLs})=\Gamma_{ML}$, applying a second multilayer system comprising at least two but no more than five further stacks to the first multilayer system, said further stacks each having a layer having a thickness ds composed of a material having a higher real part of the refractive index at the operating wavelength and a layer having a thickness da composed of a material having a lower real part of the refractive index at the operating wavelength, wherein the thickness ratio is $d_a/(da+d_s)=\Gamma$ and $\Gamma>1.2*\Gamma_{ML}$ or $\Gamma<0.8*\Gamma_{ML}$, and applying a further layer composed of the material from the group consisting of ruthenium, cerium, yttrium, molybdenum silicide, ytttrium oxide, molybdenum sulfide, zirconium, niobium, molybdenum carbide, zirconium oxide, rhenium, and rhodium directly to the at least two but no more than five further stacks, wherein the first multilayer system is arranged between the second multilayer system and the substrate, and wherein the first multilayer system is configured to reflect EUV radiation at the operating wavelength, and the second multilayer system reduces reflectivity of the optical element at the operating wavelength to less than that of the first multilayer layer system.

2. The method according to claim 1, wherein at least one layer of the further stacks is applied via electron beam evaporation or magnetron sputtering with thermal particles or ion beam assisted coating.

3. The method according to claim 1, wherein at least one layer of the further stacks is not ion beam polished or is polished with an ion beam whose energy is set such that the ion beam penetrates entirely through the at least one layer of the further stacks.

4. The method according to claim 1, wherein at least one of the materials of which the layers of the stacks of the first multilayer system are composed is the same as at least one of the materials of which the layers of the further stacks are composed.

5. The method according to claim 1, wherein the layers of both the stacks of the first multilayer system and the further stacks are composed of silicon as the material having the higher real part of the refractive index at the operating wavelength, and the layers of both the stacks of the first multilayer system and the further stacks are composed of molybdenum as the material having the lower real part of the refractive index at the operating wavelength.

6. The method according to claim 1, wherein the materials having the higher real part of the refractive index at the operating wavelength differ respectively in the layers of the stacks of the first multilayer system and in the layers of the further stacks, and the materials having the lower real part of the refractive index at the operating wavelength differ respectively in the layers of the stacks of the first multilayer system and in the layers of the further stacks.

7. The method according to claim 1, further comprising applying an additional layer as diffusion barrier in each of the further stacks between the layer having the lower refractive index at the operating wavelength and the layer having the higher refractive index at the operating wavelength.

8. The method according to claim 1, further comprising applying a third multilayer system arranged between the first multilayer system and the substrate, wherein the third multilayer system comprises a stress-compensating multilayer system.

\* \* \* \* \*